US009433109B2

(12) United States Patent
Kaneko et al.

(10) Patent No.: US 9,433,109 B2
(45) Date of Patent: Aug. 30, 2016

(54) WIRING SUBSTRATE AND SEMICONDUCTOR PACKAGE

(71) Applicant: SHINKO ELECTRIC INDUSTRIES CO., LTD., Nagano (JP)

(72) Inventors: Kentaro Kaneko, Nagano (JP); Katsuya Fukase, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 119 days.

(21) Appl. No.: 14/308,853

(22) Filed: Jun. 19, 2014

(65) Prior Publication Data

US 2015/0009645 A1    Jan. 8, 2015

(30) Foreign Application Priority Data

Jul. 3, 2013    (JP) ................. 2013-140119

(51) Int. Cl.
*H05K 1/11*    (2006.01)
*H05K 1/18*    (2006.01)
(Continued)

(52) U.S. Cl.
CPC ............ *H05K 3/4682* (2013.01); *H05K 1/112* (2013.01); *H05K 1/181* (2013.01); *H05K 3/4007* (2013.01); *H01L 2224/16237* (2013.01); *H01L 2224/16238* (2013.01); *H01L 2224/32225* (2013.01); *H01L 2224/73204* (2013.01); *H01L 2224/83385* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01); *H01L 2924/19106* (2013.01); *H05K 1/113* (2013.01); *H05K 3/3436* (2013.01); *H05K 3/381* (2013.01);
(Continued)

(58) Field of Classification Search
CPC ............... H05K 1/112; H05K 2201/10674; H05K 3/4007; H05K 3/4682; H05K 2203/308; H05K 1/0284; H05K 1/11; H05K 1/111; H05K 1/119; H05K 1/18; H05K 1/181; H05K 3/30; H05K 3/341; H05K 2201/09372; H05K 2201/09481; H05K 2201/09827; H05K 2201/09845; H01L 2224/16237; H01L 2224/32225; H01L 2224/73204; H01L 2224/83385; H01L 2924/15311; H01L 2924/15331; H01L 2924/19041; H01L 2924/19042; H01L 2924/19043
USPC ................. 174/250–268; 361/760, 792–795; 257/778
See application file for complete search history.

(56) References Cited

U.S. PATENT DOCUMENTS 7,222,421 B2    5/2007   Nakamura
7,462,784 B2 *  12/2008  Kariya ................ H01L 21/4857
                                                                174/260

(Continued)

FOREIGN PATENT DOCUMENTS

JP          4541763        9/2010

*Primary Examiner* — Ishwarbhai B Patel
(74) *Attorney, Agent, or Firm* — IPUSA, PLLC

(57) ABSTRACT

A wiring substrate includes an insulating layer that is an outermost layer of the wiring substrate and includes an external exposed surface, a pad forming part formed on a side of the external exposed surface, and a pad that projects from the external exposed surface. The pad forming part includes a recess part recessed from the external exposed surface, and a weir part that projects from the external exposed surface and encompasses the recess part from a plan view. The pad includes a pad body formed within the recess part and the weir part, and an eave part formed on the weir part. The pad body includes an end part that projects to the weir part. The eave part projects in a horizontal direction from the end part of the pad body. The end part of the pad body includes a flat surface.

7 Claims, 10 Drawing Sheets

(51) Int. Cl.
  *H05K 3/46* (2006.01)
  *H05K 3/40* (2006.01)
  *H05K 3/34* (2006.01)
  *H05K 3/38* (2006.01)

(52) U.S. Cl.
  CPC . *H05K2201/0367* (2013.01); *H05K 2201/096* (2013.01); *H05K 2201/09045* (2013.01); *H05K 2201/09481* (2013.01); *H05K 2201/09827* (2013.01); *H05K 2201/10674* (2013.01); *H05K 2201/10977* (2013.01); *H05K 2201/2072* (2013.01); *H05K 2203/0152* (2013.01); *H05K 2203/0376* (2013.01); *H05K 2203/1184* (2013.01); *H05K 2203/308* (2013.01)

(56) References Cited

U.S. PATENT DOCUMENTS

| | | | |
|---|---|---|---|
| 2010/0139962 A1* | 6/2010 | Kaneko | H01L 21/4857 174/260 |
| 2010/0147574 A1* | 6/2010 | Kaneko | H01L 21/4853 174/261 |
| 2011/0220399 A1* | 9/2011 | Niki | H05K 1/115 174/258 |

* cited by examiner

WIRING SUBSTRATE AND SEMICONDUCTOR PACKAGE

CROSS-REFERENCE TO RELATED APPLICATIONS

This application is based upon and claims the benefit of priority of the prior Japanese Patent Application No. 2013-140119 filed on Jul. 3, 2013, the entire contents of which are incorporated herein by reference.

FIELD

The embodiments discussed herein are related to a wiring substrate and a semiconductor package having a semiconductor chip mounted on the wiring substrate.

BACKGROUND

Conventionally, there is known a so-called built-up wiring substrate in which wiring layers and insulating layers are alternately layered one on top of the other, and wiring layers are connected to each other by way of via holes penetrating the insulating layers. Among built-up wiring substrates, there is a built-up wiring substrate that is formed with a pad projecting from a surface of the built-up wiring substrate (hereinafter also referred to as "projection pad"). The projection pad of the built-up wiring substrate is bonded to a projection electrode of a semiconductor chip when the built-up wiring substrate is flip-chip bonded to the semiconductor chip.

In order to form the projection pad in the built-up wiring substrate, recess parts are formed by performing a wet-etching process on a support body that is used in a process of manufacturing the built-up wiring substrate. Then, metal parts, which are to become projection pads, are formed in the recess parts by using, for example, an electroplating method. Then, the support body is removed. Thereby, the projection pads are formed (see, for example, Japanese Registered Patent No. 4541763).

However, because the above-described method of forming the projection pads uses the wet-etching method to form the recess parts in the support body, the depths of the recess parts may become inconsistent due to the unevenness in the etching amount of the wet-etching method. Further, because the projection pad has a dome-like shape, a center part of the projection pad cannot be flat. Therefore, the area in which the projection pad contacts a corresponding projection electrode of the semiconductor chip is small. Thus, it is difficult to attain a sufficient connection reliability when bonding the projection pad to the projection pad of the semiconductor chip.

SUMMARY

According to an aspect of the invention, there is provided a wiring substrate that includes an insulating layer that is an outermost layer of the wiring substrate and includes an external exposed surface, a pad forming part formed on a side of the external exposed surface, and a pad that projects from the external exposed surface. The pad forming part includes a recess part recessed from the external exposed surface, and a weir part that projects from the external exposed surface and encompasses the recess part from a plan view. The pad includes a pad body formed within the recess part and the weir part, and an eave part formed on the weir part. The pad body includes an end part that projects to the weir part. The eave part projects in a horizontal direction from the end part of the pad body. The end part of the pad body includes a flat surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
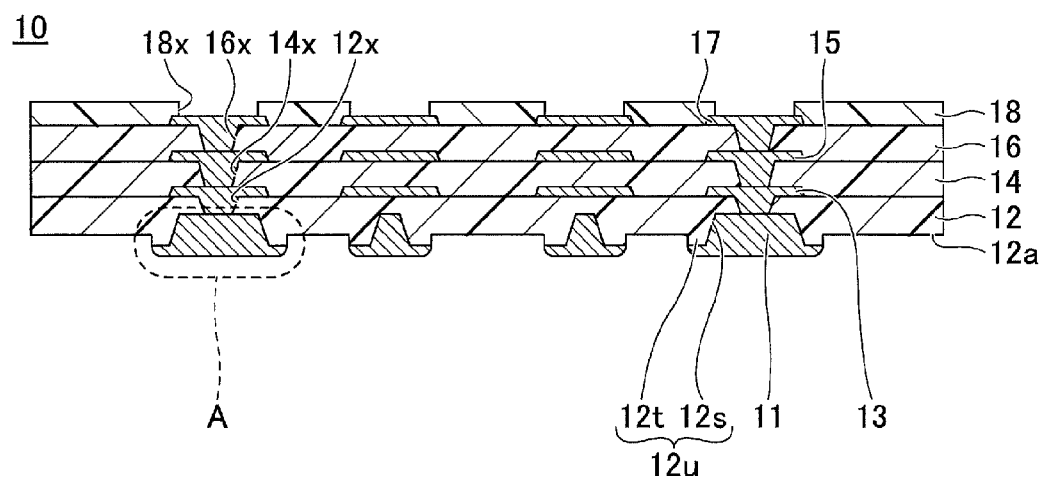
FIGS. 1A and 1B are schematic diagrams illustrating a wiring substrate according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of Wiring Substrate of First Embodiment

First, a structure of a wiring substrate 10 according to a first embodiment of the present invention is described. FIG.

1 is a cross-sectional view of the wiring substrate 10 of the first embodiment. FIG. 1B is an enlarged cross-sectional view illustrating part A of FIG. 1A.

Figure 1B:
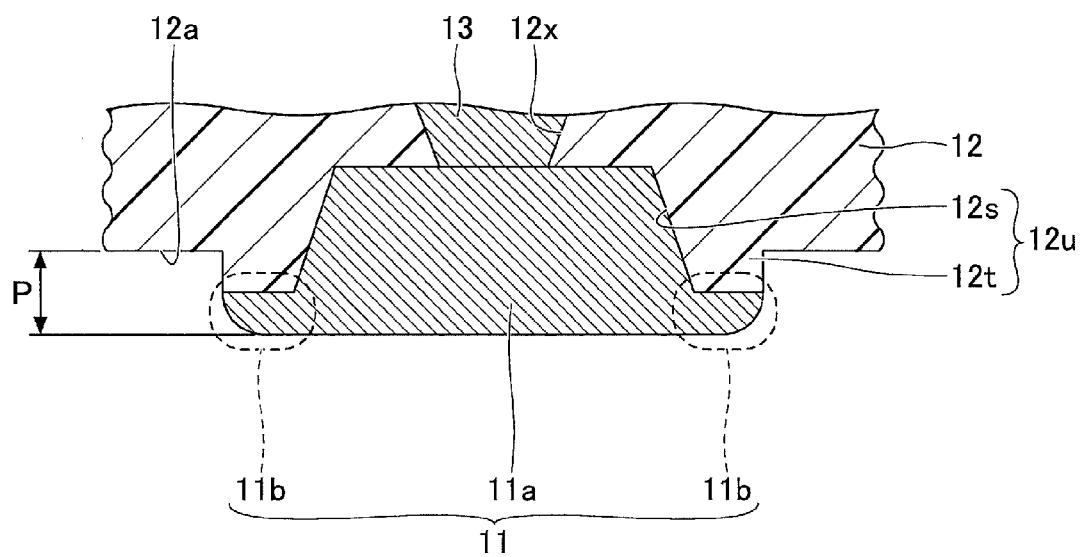

With reference to FIGS. 1A and 1B, the wiring substrate 10 of the first embodiment is a coreless built-up wiring substrate including, for example, a pad 11, an insulating layer 12, a wiring layer 13, an insulating layer 14, a wiring layer 15, an insulating layer 16, a wiring layer 17, and a solder resist layer 18. It is to be noted that a wiring pattern that is to be connected to the pad 11 may be formed on a lower surface of the insulating layer 12.

For the sake of convenience, in this embodiment, the term "lower" refers to a side toward the insulating layer 12, and the term "upper" refers to a side toward the solder resist layer 18. For example, a surface of the insulating layer 12 contacting the insulating layer 14 is an upper surface of the insulating layer 12, and a surface of the insulating layer 12 that is exposed (i.e. a surface of the insulating layer 12 opposite to the surface contacting the insulating layer 14) is a lower surface of the insulating layer 12.

The insulating layer 12 is an outermost insulating layer provided on one side of the wiring substrate 10. For example, an insulating material having a thermosetting resin (e.g., an epoxy type resin, a polyimide resin) as a main component may be used as the material of the insulating layer 12. The insulating layer 12 may include a filler such as silica ($SiO_2$). The thickness of the insulating layer 12 may be, for example, approximately 15 μm to 35 μm.

A pad forming part 12u including a recess part 12s and a weir part 12t formed on a side of an external exposed surface 12a of the insulating layer 12. The recess part 12s is recessed toward the insulating layer 14 from the external exposed surface 12a of the insulating layer 12. The cross section of the recess part 12s is a tapered shape in which a width of the recess part 12s at a side toward a bottom surface of the recess part 12s (i.e. a side toward the insulating layer 14) is less than a width of the recess part 12s at the side toward the external exposed surface 12a. For example, in a case where the pad 11 has a circular shape from a plan view, the recess part 12s may be formed into a circular truncated cone shape.

It is to be noted that, in this embodiment, a plan view refers to an illustration of an object viewed from a direction of a line normal to the external exposed surface 12a of the insulating layer 12. A plan-view shape refers to a shape of an object in a case where the object is viewed from a direction of a line normal to the external exposed surface 12a of the insulating layer 12.

The weir part 12t is provided to encompass the recess part 12s from a plan view. The weir part 12t projects from the external exposed surface 12a of the insulating layer 12 in a direction opposite to the insulating layer 14. For example, in a case where the recess part 12s has a circular truncated cone shape, the weir part 12t may be formed into a circular annular shape. The weir part 12t and the insulating layer 12 may be formed as a united body by forming the weir part 12t and the insulating layer 12 with the same insulating resin.

The pad 11 is provided in the pad forming part 12u. The pad 11 projects from the external exposed surface 12a of the insulating layer 12 in a direction opposite to the insulating layer 14. The amount (projection amount) P in which the pad 11 projects from the external exposed surface 12a of the insulating layer 12 may be, for example, approximately a few μm. The pad 11 includes a pad body 11a and an eave part 11b. The pad body 11a is formed (embedded) in an inner side of the recess part 12s and an inner side of the weir part 12t. The pad body 11a has one end part (outer end part) projecting from the weir part 12t. The eave part 11b, which projects from the one end part of the pad body 11a in a horizontal direction (sideways), is formed on the weir part 12t. The area extending from an outer peripheral side of the eave part 11b to a side surface of the weir part 12t may have an inclined surface (e.g., cross section having a rounded convex shape).

The one end part of the pad body 11a includes a flat surface to be connected to a connection object (e.g., electrode of semiconductor chip). That is, the pad 11 has a surface which is to be connected to the connection object (connection surface). The connection surface of the pad 11 is exposed from the insulating layer 12 and is flat at least at the vicinity of its center part.

Accordingly, because at least a part of the surface of the pad 11 to be connected to the connection object is a flat surface, the area that is to contact the connection object can be increased. Therefore, the connection reliability between the pad 11 and the connection object is improved. According to this embodiment, the "flat surface" does not necessarily need to be a precisely flat surface. The "flat surface" need only be flat to the extent of achieving predetermined effects including, for example, improvement of connection reliability.

A surface of the pad 11 that contacts the recess part 12s and the weir part 12t is formed into a roughened surface. In other words, the surface of the pad 11 that contacts the recess part 12s and the weir part 12t is a surface having a roughness greater than a surface of the pad 11 that does not contact the recess part 12s and the weir part 12t (exposed surface of the pad 11 including the flat surface). Thereby, an anchor effect is caused, so that cohesiveness between the pad 11 and the insulating layer 12 (pad forming part 12u) can be improved.

The material of the pad 11 may be, for example, copper (Cu). Although a plan-view shape of the pad 11 may be an arbitrary shape, the plan-view shape of the pad 11 may be, for example, a circular shape. In a case where the plan-view shape of the pad 11 is a circular shape, a diameter of the pad 11 or the pitch between multiply arranged pads 11 may be arbitrarily determined. The pads 11 may be provided with different diameters and pitches. For example, the pads 11 for a semiconductor chip to be mounted on may have small diameters and narrow pitches therebetween. On the other hand, the pads 11 to be connected to, for example, other wiring substrates or a semiconductor package may have large diameters and wide pitches therebetween.

For example, in the wiring substrate 10 according to an embodiment of the present invention, the pads 11 for a semiconductor chip to be mounted on are provided at a center area of the external exposed surface 12a of the insulating layer 12 whereas the pads 11 to be connected to, for example, other wiring substrates or a semiconductor package are provided at an outer peripheral area of the external exposed surface 12a. Further, the pads 11 to be mounted on a semiconductor chip may be connected to the pads 11 to be connected to, for example, other wiring substrates or a semiconductor package by way of the below-described wiring pattern 21 of FIG. 6D.

The thickness of the pad body 11a may be, for example, approximately 10 μm to 20 μm. Further, the thickness of the eave part 11b (thickness of thickest part of the eave part 11b) may be, for example, a few μm.

According to necessity a metal layer may be formed on the exposed surface of the pad 11. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). Further, an anti-oxidation process such as an OSP (Organic Solderability Preservative) process may be performed on the exposed surface of the pad 11.

The wiring layer 13 is formed on the insulating layer 12. The insulating layer 12 has a via hole 12x penetrating therethrough and exposing an upper surface of the pad 11 (a part of the pad body 11a formed at a bottom surface of the recess part 12s). The wiring layer 13 includes a via wiring that fills the inside of the via hole 12x and a wiring pattern that is formed on the upper surface of the insulating layer 12. The via hole 12x is open toward the insulating layer 14 (opening part) and has a bottom surface formed by the upper surface of the electrode pad 11 (bottom part). The via hole 12x includes a recess part having a circular truncated cone shape in which the opening part of the via hole 12x has an area larger than the area of the bottom surface of the via hole 12x. In other words, the cross-sectional shape of the via wiring of the wiring layer 13 to be connected to the upper surface of the pad 11 is a tapered shape in which the width of the via wiring on the side opposite from the external exposed surface 12a is greater than the side of the external exposed surface 12a.

The wiring layer 13 is electrically connected to the electrode pad 11 exposed in the bottom part of the via hole 12x. For example, copper (Cu) may be used as the material of the wiring layer 13. The thickness of a wiring pattern constituting the wiring layer 13 may be, for example, approximately 10 µm to 20 µm. The wiring layer 13 may include one or more pads 11 that are not connected to the via wiring of the wiring layer 13.

The insulating layer 14 is formed on the upper surface of the insulating layer 12 and covers the wiring layer 13. The material of the insulating layer 14 may be the same as the material of the insulating layer 12. The insulating layer 14 may include a filler such as silica ($SiO_2$). The thickness of the insulating layer 14 may be, for example, approximately 15 µm to 35 µm.

The wiring layer 15 is formed on the insulating layer 14. The insulating layer 14 has a via hole 14x penetrating therethrough and exposing an upper surface of the wiring layer 13. The wiring layer 15 includes a via wiring that fills the inside of the via hole 14x and a wiring pattern that is formed on the upper surface of the insulating layer 14. The via hole 14x is open toward the insulating layer 16 (opening part) and has a bottom surface formed by the upper surface of the wiring layer 13 (bottom part). The via hole 14x includes a recess part having a circular truncated cone shape in which the opening part of the via hole 14x has an area larger than the area of the bottom surface of the via hole 14x.

The wiring layer 15 is electrically connected to the wiring layer 13 exposed in the bottom part of the via hole 14x. For example, copper (Cu) may be used as the material of the wiring layer 15. The thickness of a wiring pattern constituting the wiring layer 15 may be, for example, approximately 10 µm to 20 µm.

The insulating layer 16 is formed on the upper surface of the insulating layer 14 and covers the wiring layer 15. The material of the insulating layer 16 may be the same as the material of the insulating layer 12. The insulating layer 16 may include a filler such as silica ($SiO_2$). The thickness of the insulating layer 16 may be, for example, approximately 15 µm to 35 µm.

The wiring layer 17 is formed on the insulating layer 16. The insulating layer 16 has a via hole 16x penetrating therethrough and exposing an upper surface of the wiring layer 15. The wiring layer 17 includes a via wiring that fills the inside of the via hole 16x and a wiring pattern that is formed on the upper surface of the insulating layer 16. The via hole 16x is open toward the solder resist layer 18 (opening part) and has a bottom surface formed by the upper surface of the wiring layer 15 (bottom part). The via hole 16x includes a recess part having a shape of a circular truncated cone. The opening part of the via hole 16x has an area larger than the area of the bottom surface of the via hole 16x.

The wiring layer 17 is electrically connected to the wiring layer 15 exposed in the bottom part of the via hole 16x. For example, copper (Cu) may be used as the material of the wiring layer 17. The thickness of a wiring pattern constituting the wiring layer 17 may be, for example, approximately 10 µm to 20 µm.

The solder resist layer 18 is formed on the upper surface of the insulating layer 16 and covers the wiring layer 17. The solder resist layer 18 includes an opening part 18x. A part of the wiring layer 17 is exposed in a bottom part of the opening part 18x. The wiring layer 17, which has a part exposed in the bottom part of the opening part 18x, functions as a pad that is to be electrically connected to another wiring substrate or a semiconductor package.

For example, a photosensitive insulating resin material (e.g., epoxy type resin, acrylic resin) may be used as the material of the solder resist layer 18. The thickness of the solder resist layer 18 may be, for example, approximately 15 µm to 35 µm.

According to necessity, a metal layer may be formed on the upper surface of the wiring layer 17 exposed at the bottom part of the opening part 18x. The metal layer is formed with, for example, the same material as the above-described metal layer that may be formed on the exposed surface of the pad 11. Further, an anti-oxidation process such as an OSP (Organic Solderability Preservative) process may be performed on the upper surface of the wiring layer 17.

In the wiring substrate 10, the wiring pattern constituting the wiring layer 17 may be formed extending to the upper surface of the insulating layer 16, so that the wiring layer is exposed from the opening part 18x of the solder resist layer 18 and used to function as a pad. In other words, a part of the wiring layer 17 other than the part formed on the via hole 16x may be used to function as a pad.

Method for Manufacturing Wiring Substrate of First Embodiment

Next, a method for manufacturing a wiring substrate according to the first embodiment of the present invention is described. FIGS. 2A-5C are schematic diagrams for describing the processes in manufacturing the wiring substrate according to the first embodiment of the present invention. In this embodiment, multiple wiring substrates are manufactured by forming multiple components that are to become the wiring substrates on a support body, removing the support body from the multiple components, and cutting the multiple components into individual wiring substrates. However, multiple wiring substrates may be manufactured by forming each wiring substrate on a support body and removing the support wiring substrate from the support body.

Figure 2A:
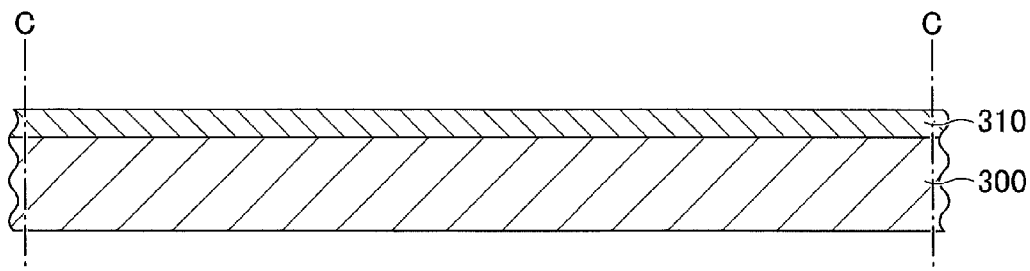
FIGS. 2A-2D are schematic diagrams illustrating processes for manufacturing the wiring substrate according to the first embodiment of the present invention (part 1)

First, in the process illustrated in FIG. 2A, a support body 300 having a flat upper surface is prepared. A first metal layer 310 is formed on the upper surface of the support body 300. Although a silicon substrate, glass substrate, a metal substrate, or a metal foil may be used as the support body 300, this embodiment uses copper foil as the support body 300. The copper foil is used as the support body 300 because the copper foil can be used as a power-feeding layer for performing electroplating in the below-described process illustrated in FIGS. 2D and 3A, and because the copper foil can be easily removed by etching in the below-described process illustrated in FIG. 5B. The thickness of the support body 300 may be, for example, approximately 35 µm to 100 µm.

The first metal layer 310 is formed of a material that can be selectively removed (e.g., etched) with respect to the support body 300. In this embodiment, copper foil is used as the support body 300. Thus, for example, nickel (Ni), which can be selectively removed with respect to copper, is used as the material of the first metal layer 310. The first metal layer 310 may be formed by, for example, an electroplating method using the support body 300 as the power-feeding layer.

The thickness of the first metal layer 310 may be, for example, approximately 10 µm. The thickness of the first metal layer 310 is roughly determined according to the thickness of the eave part 11b (thickness of thickest part of the eave part 11b). Therefore, the thickness of the first metal layer 310 may be determined to match the specifications of the thickness of the eave part 11b (thickness of thickest part of the eave part 11b).

Figure 2B:
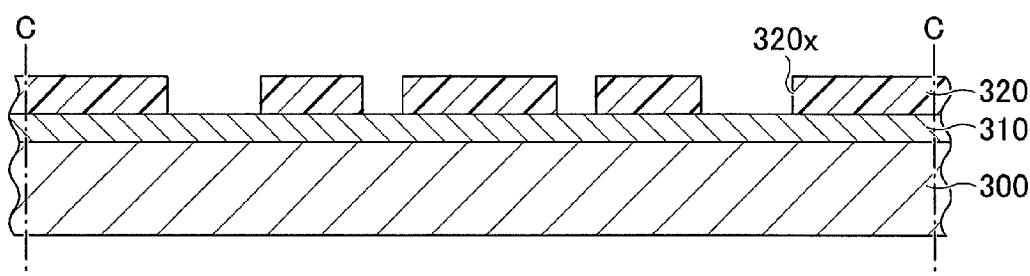

Then, in the process illustrated in FIG. 2B, a resist layer 320 is formed on the upper surface of the first metal layer 310 (the surface of the first metal layer 310 that is not contacting the support body 300). The resist layer 320 includes opening parts 320x corresponding to the below-described pad forming parts 12u. In order to form the resist layer 320, a liquid or paste-like resin formed of a photosensitive resin compound is applied to the upper surface of the first metal layer 310. The photosensitive resin compound of the liquid or paste-like resist may include, for example, an epoxy type resin or an acrylic type resin. Alternatively, a film-like resin (e.g., dry film resist) formed of a photosensitive resin compound may be laminated on the upper surface of the first metal layer 310.

Then, the opening parts 320x are formed by exposing and developing the resist applied or laminated on the upper surface of the first metal layer 310. Thereby, the resist layer 320 including the opening parts 320x is formed on the first metal layer 310. Alternatively, a film-like resist that is already formed with the opening parts 320x may be laminated on the upper surface of the first metal layer 310. The plan-view shape of the opening part 320x may be, for example, a circular shape.

Figure 2C:
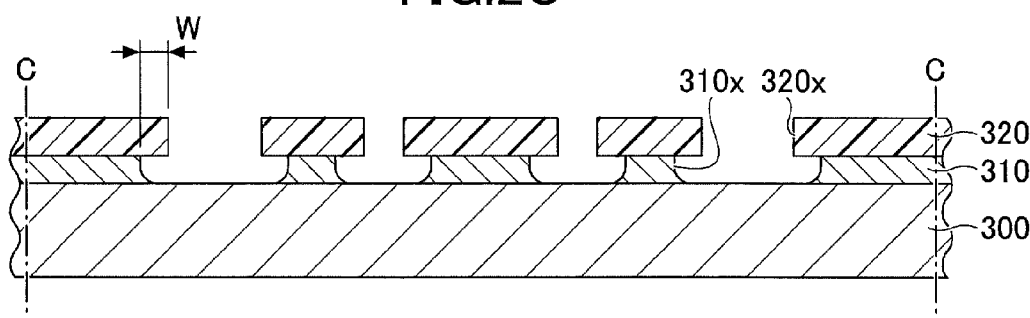

Then, in the process illustrated in FIG. 2C, a removal process is performed on the support body 300 in which recess parts 310x are formed by selectively removing parts of the first metal layer 310 via the opening parts 320x. Thereby, an upper surface of the support body 300 is exposed at the bottom parts of the recess parts 310x. In a case where the first metal layer 310 is formed of, for example, nickel (Ni), the removal process may be performed by using, for example, a hydrogen peroxide/nitric acid type solution. Because the first metal layer 310 is etched not only in its vertical direction but also in its horizontal direction, an inner side surface of the recess part 310x is formed by digging into a part of the first metal layer 310 below the resist layer 320 in a horizontal direction from the inner sidewall surface of the opening part 320x.

In other words, the plan-view shape of the recess part 310x expands further outward from the outer periphery of the plan-view shape of the opening part 320x. For example, in a case where the plan-view shape of the opening part 320x is a circle, the recess part 310x is formed having a plan-view shape with a diameter larger than a diameter of the plan-view shape of the opening part 320x. Thus, an inner sidewall surface of the recess part 310x is formed by further digging into the first metal layer 310 in a horizontal direction below the resist layer 320. The dug part of the first metal layer 310 between the inner sidewall surface of the recess part 310 and an inner sidewall surface of the opening part 320x has a width that is substantially the same as the thickness of the first metal layer 310 because the etched amount of the first metal layer 310 in its vertical direction is substantially the same as the etched amount of the first metal layer 310 in its horizontal direction. Further, a lower edge side (side that contacts the support body 300) of the inner sidewall surface of the recess part 310x is rounded. Thus, for example, the cross-sectional shape of the lower edge side of the inner sidewall surface of the recess part 310x becomes a rounded convex shape.

In this embodiment, a material that is a selectively removable with respect to the support body 300 is used for the first metal layer 310. Therefore, the upper surface of the support body 300 is not etched when forming the recess parts 310x by removing the first metal layer 310. Accordingly, even after the forming of the recess parts 310x, the upper surface of the support body 300 remains flat. In other words, the upper surface of the support body 300 exposed at the bottom part of each recess part 310x is flat. Therefore, the pad 11, which is to be formed in the recess part 310x in a subsequent process, can be formed to have a flat surface at least at a part that contacts the contact object. Further, the heights of the pads 11 can be prevented from becoming inconsistent (inconsistency in the amount in which the pads 11 project from the external exposed surface 12a of the insulating layer 12).

Figure 2D:
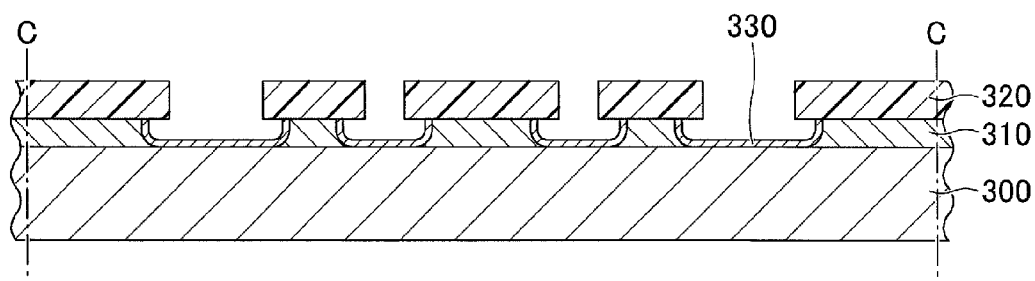

Then, in the process illustrated in FIG. 2D, the second metal layer (barrier layer) 330 that covers the bottom surface of the recess part 310x (upper surface of the support body 300 exposed at the bottom part of the recess part 310x) and the inner sidewall surface of the recess part 310x is formed. The second metal layer 330 is formed by, for example, an electroplating method using the support body as the power-feeding layer. The second material layer 330 is formed with a material that prevents the second metal layer 330 from being removed at the same time of removing the support body 300. Because copper foil is used for the support body 300 in this embodiment, the second metal layer 330 may be formed of a material (e.g., nickel (Ni)) that cannot be removed by an etching liquid capable of removing copper. The second metal layer 330 may be formed on the bottom surface of the recess part 310x and the inner sidewall surface of the recess part 310x with a thickness of, for example, approximately 0.5 µm to 2 µm, so that the second metal layer 330 does not entirely fill the recess part 310x.

Figure 3A:
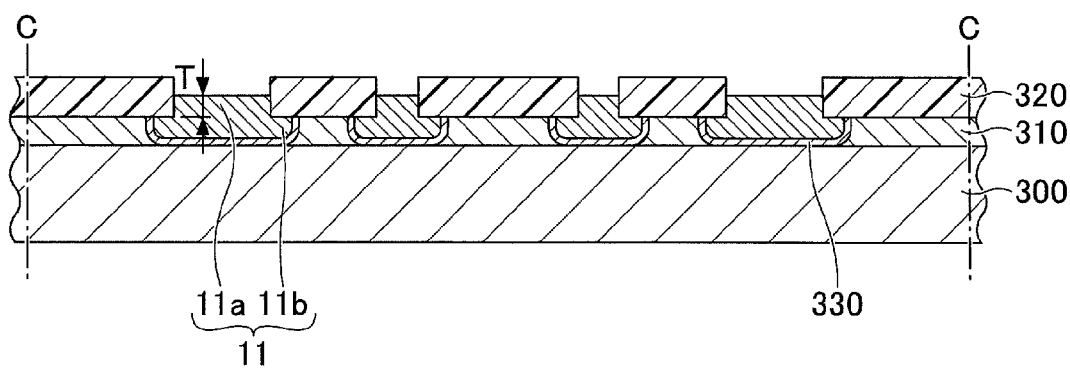
FIGS. 3A-3C are schematic diagrams illustrating processes for manufacturing the wiring substrate according to the first embodiment of the present invention (part 2)

Then, in the process illustrated in FIG. 3A, the pad 11 is formed by, for example, an electroplating method using the support body 300 as the power-feeding layer. The pad 11 extends into opening part 320x from the second metal layer 330 formed on the bottom and inner sidewall surfaces of the recess part 310x. The pad 11 has a structure including the pad body 11a and the eave part 11b that projects sideways (horizontal direction) at a lower end part of the pad body 11a. For example, copper (Cu) may be used as the material of the pad 11. The thickness T of the part of the pad 11 that extends into the opening part 320x may be, for example, approximately a few tens of µm.

Figure 3B:
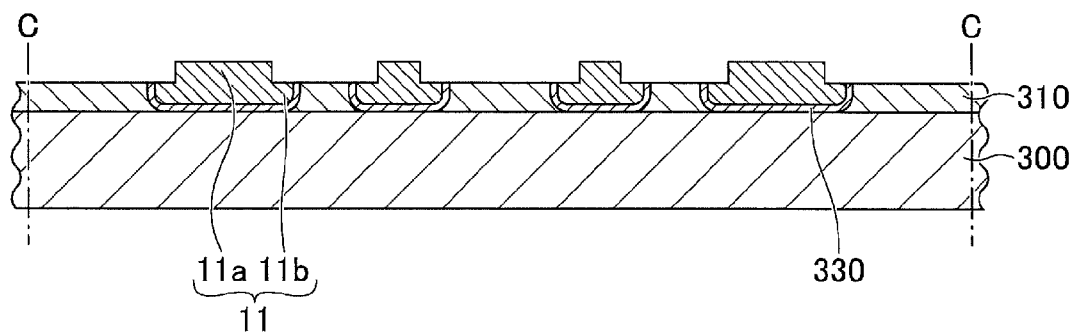

Then, in the process illustrated in FIG. 3B, the resist layer 320 is removed. Thereby, the upper and side surfaces of the pad body 11a and the upper surface of the eave part 11b become exposed.

Figure 3C:
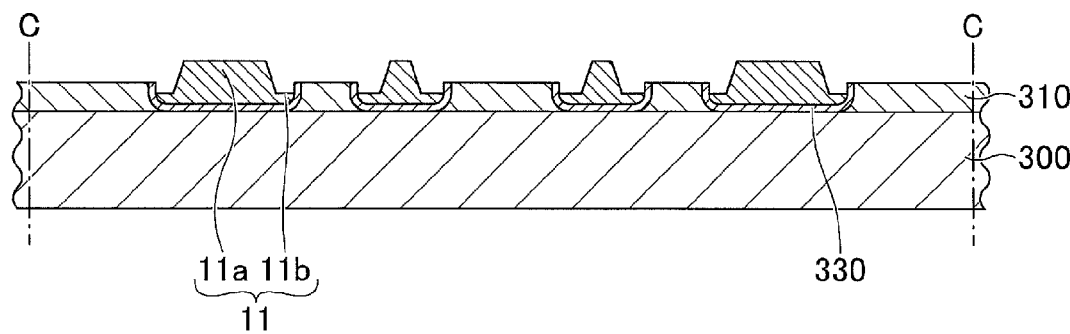

Then, in the process illustrated in FIG. 3C, the exposed surfaces of the first and second metal layers 310, 330 of the pad 11 are roughened by etching. Thereby, the upper and side surfaces of the pad body 11a and the upper surface of the eave part 11b are roughened. For example, an etching liquid of a formic acid or an acetic acid may be used in the roughening (etching) process. It is to be noted that the side surface of the pad body 11a becomes an inclined surface by removing a part of the upper and lower surfaces of the pad body 11a with the etching process. For example, in a case where a part of the pad body 11a exposed at the first and second metal layers 310, 330 has a circular cylindrical shape before the etching process, the part of the pad body 11a exposed at the first and second metal layers 310, 320 is formed into a circular truncated cone shape by the etching process. By removing a part of the upper surface of the eave part 11b, the upper surface of the eave part 11b becomes recessed with respect to the upper surface of the first metal layer 310.

Figure 4A:
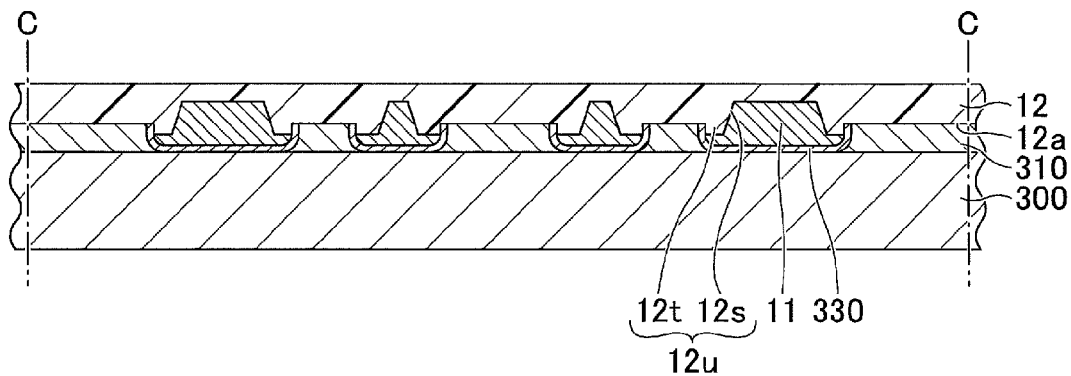
FIGS. 4A-4C are schematic diagrams illustrating processes for manufacturing the wiring substrate according to the first embodiment of the present invention (part 3)

Then, in the process illustrated in FIG. 4A, the insulating layer 12 that covers at least a part of the pad 11 is formed on the upper surface of the first metal layer 310. A peripheral part of the pad 11 becomes the pad forming part 12u including the recess part 12s and the weir part 12t. For example, a material having a thermosetting epoxy type resin as a main component may be used as the material of the insulating layer 12. The insulating layer 12 may include a filler such as silica ($SiO_2$). The thickness of the insulating layer 12 may be, for example, approximately 15 μm to 35 μm.

In a case where, for example, a film-like thermosetting insulating resin having an epoxy type resin as a main component is used as the material of the insulating layer 12, the insulating layer 12 is formed as follows. An insulating resin film being in a semi-cured state is laminated on the upper surface of the first metal layer 310. The laminated insulating resin covers the electrode pads 11. Then, the laminated insulating resin is cured by applying a pressing force to the laminated insulating resin while heating the laminated insulating resin to a temperature greater than or equal to a thermosetting temperature. Thereby, the insulating layer 12 is formed. It is to be noted that generation of voids can be prevented by laminating the insulating resin in a vacuum atmosphere.

In a case where, for example, a liquid or a paste-like thermosetting insulating resin having an epoxy type resin as a main component is used as the material of the insulating layer 12, the insulating layer 12 is formed as follows. An insulating resin liquid or paste is applied on the upper surface of the first metal layer 310 by using, for example, a spin-coating method. The applied insulating resin covers the electrode pads 11. Then, the applied insulating resin is cured by heating the applied insulating resin to a temperature greater than or equal to a thermosetting temperature. Thereby, the insulating layer 12 is formed.

Figure 4B:
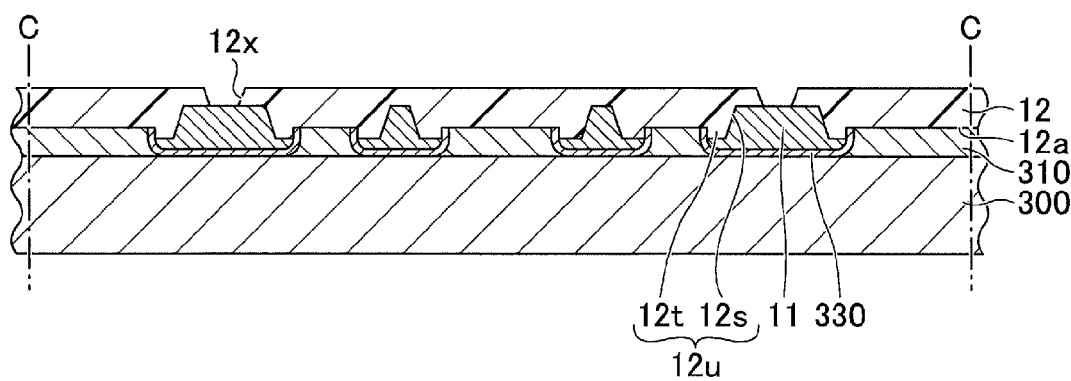

Then, in the process illustrated in FIG. 4B, one or more via holes 12x, which penetrate the insulating layer 12 and expose the upper surface of the pads 11, are formed in the insulating layer 12. The via hole 12x may be formed by, for example, a laser processing method using a $CO_2$ laser. The via hole 12x formed by the laser processing method includes a recess part having a shape of a circular truncated cone. The via hole 12x has an opening part toward the insulating layer 14 and a bottom surface part on the upper surface of the electrode pad 11. The area of the opening part of the via hole 12x is larger than the area of the bottom surface part of the via hole 12x.

Other via holes may also be formed with the same shapes as the via holes 12x by using the same laser processing method for forming the via holes 12x. In a case where the via hole 12x is formed by using the laser processing method, it is preferable to remove residual resin of the insulating layer 12 adhered to the upper surface of the pad 11 exposed in the bottom part of the via hole 12x. In this case, a desmearing process may be used to remove the residual resin of the insulating layer 12.

Figure 4C:
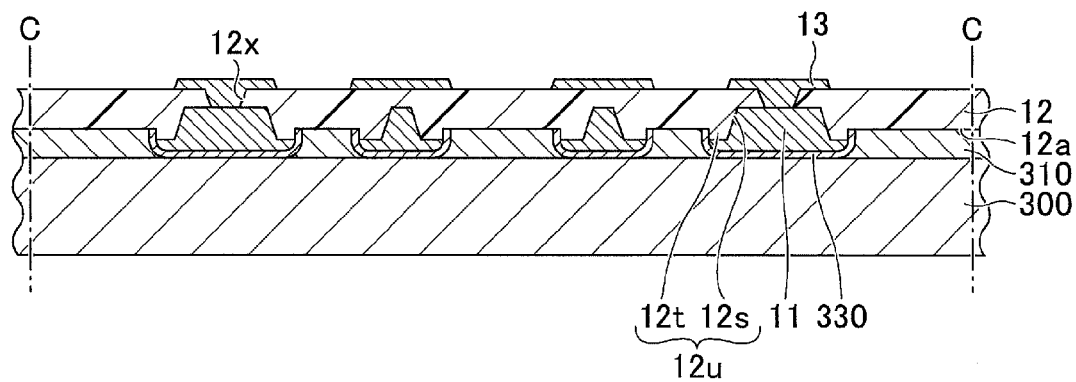

Then, in the process illustrated in FIG. 4C, a wiring layer 13 is formed on the insulating layer 12. The wiring layer 13 includes a via wiring and a wiring pattern. The via wiring fills the inside of the via hole 12x. The wiring pattern is formed on the upper surface of the insulating layer 12. The wiring layer 13 is electrically connected to the pad 11 exposed on the bottom part of the via hole 12x. For example, copper (Cu) may be used as the material of the wiring layer 13. Various wiring forming methods (e.g., semi-additive method, subtractive method) may be used to form the wiring layer 13.

Figure 5A:
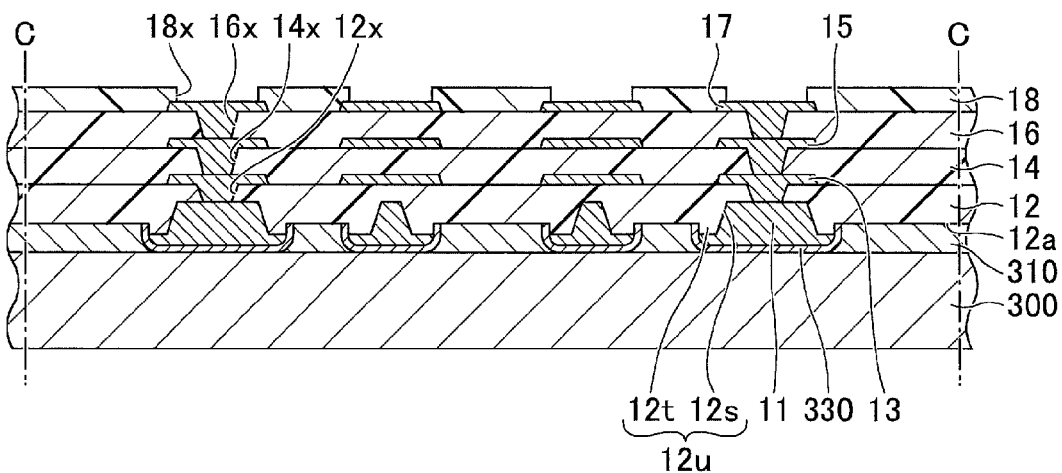
FIGS. 5A-5C are schematic diagrams illustrating processes for manufacturing the wiring substrate according to the first embodiment of the present invention (part 4)

Then, in the process illustrated in FIG. 5A, by repeating the above-described processes illustrated in FIGS. 4A-4C, the insulating layer 14, the wiring layer 15, the insulating layer 16, the wiring layer 17, and the solder resist layer 18 are layered on the insulating layer 12 as illustrated in FIG. 5A. That is, the via hole 14x, which penetrates the insulating layer 14 and exposes the upper surface of the wiring layer 13, is formed after the insulating layer 14 covering the wiring layer 13 is formed on the insulating layer 12. The material of the insulating layer 14 may be the same insulating resin used for forming the insulating layer 12. The insulating layer 14 may include a filler such as silica ($SiO_2$). The thickness of the insulating layer 14 may be, for example, approximately 15 μm to 35 μm.

Then, a wiring layer 15 is formed on the insulating layer 14. The wiring layer 15 is connected to the wiring layer 13 by way of the via hole 14x. The wiring layer 15 includes a via wiring that fills the inside of the via hole 14x and the wiring layer that is formed on the insulating layer 14. The wiring layer 15 is electrically connected to the wiring layer 13 exposed in the bottom part of the via hole 14x. For example, copper (Cu) may be used as the material of the wiring layer 15. The wiring layer 15 may be formed by using, for example, a semi-additive method. The thickness of the wiring pattern of the wiring layer 15 may be, for example, approximately 10 μm to 20 μm.

Then, a via hole 16x, which penetrates the insulating layer 16 and exposes the upper surface of the wiring layer 15, is formed after the insulating layer 16 covering the wiring layer 15 is formed on the insulating layer 14. The material of the insulating layer 16 may be the same insulating resin used for forming the insulating layer 12. The insulating layer 16 may include a filler such as silica ($SiO_2$). The thickness of the insulating layer 16 may be, for example, approximately 15 μm to 35 μm.

Then, a wiring layer 17 is formed on the insulating layer 16. The wiring layer 17 is connected to the wiring layer 15 by way of the via hole 16x. The wiring layer 17 includes a via wiring that fills the inside of the via hole 16x and the wiring layer that is formed on the insulating layer 16. The wiring layer 17 is electrically connected to the wiring layer 15 exposed in the bottom part of the via hole 16x. For example, copper (Cu) may be used as the material of the wiring layer 17. The wiring layer 17 may be formed by using, for example, a semi-additive method. The thickness of the wiring pattern of the wiring layer 17 may be, for example, approximately 10 μm to 20 μm.

Thereby, a predetermined built-up wiring structure is formed on the upper surface of the support body 300. Although a built-up wiring structure including 3 layers (wiring layers 13, 15, and 17) is formed in the above-described embodiment, a built-up wiring structure including n layers ("n" being an integer greater than or equal to 1) may be formed.

Then, a solder resist layer 18 covering the wiring layer 17 is formed on the insulating layer 16. The solder resist layer 18 is formed covering the wiring layer 17 by applying a liquid or paste-like photosensitive insulating resin on the insulating layer 16 by using a screen-printing method, a roll-coating method, or a spin-coating method. Alternatively, the solder resist layer 18 may be formed covering the wiring layer 17 by laminating a film-like photosensitive insulating resin on the insulating layer 16.

An opening part 18x is formed by exposing and developing the applied or laminated insulating resin (photolithographic method). Thereby, the solder resist layer 18 including the opening part 18x can be formed. Alternatively, a film-like insulating resin having the opening part 18x formed beforehand may be laminated on the insulating layer 16 and cover the wiring layer 17. Alternatively, a non-photosensitive insulating resin may be used as the material of the solder resist layer 18. In the case where the non-photosensitive insulating resin is used, the opening part 18x is formed by, for example, a laser processing method using a $CO_2$ laser or performing a blasting process using a polishing agent (e.g., alumina abrasive grain) after the solder resist layer 18 is formed on the insulating layer 16 and cured.

By completing the process illustrated in FIG. 5A, the solder resist layer 18 including the opening part 18x is formed, and a part of the wiring layer 17 is exposed in the opening part 18x. The part of the wiring layer 17 exposed in the opening part 18x functions as a pad to be electrically connected to, for example, another wiring substrate or a semiconductor package.

According to necessity, a metal layer may be formed on the upper surface of the wiring layer 17 exposed in the bottom part of the opening part 18x by using, for example, an electroless plating method. The metal layer is formed with, for example, the same material as the above-described metal layer that may be formed on the exposed surface of the pad 11. Further, an anti-oxidation process such as an OSP (Organic Solderability Preservative) process may be performed on the upper surface of the wiring layer 17.

Figure 5B:
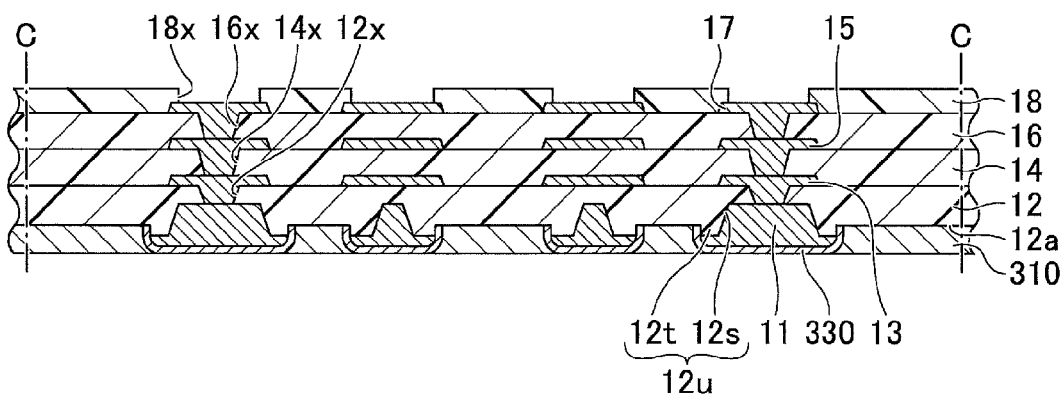

Then, in the process illustrated in FIG. 5B, the support body 300 is removed. Thereby, the first and second metal layers 310, 330 become exposed. The support body 300, which is formed of copper foil, may be removed by performing wet-etching with an etching liquid such as a ferric chloride solution, a cupric chloride solution, or an ammonium persulfate solution. The material of the first and second metal layers 310, 330 is a metal material (e.g., nickel (Ni)) that cannot be etched with a liquid for etching copper. Therefore, the support body 300 formed of copper foil can be removed by selectively etching the first and second metal layers 310, 330. That is, the first and second metal layers 310, 330 function as etch-stop layers (barrier layers).

Figure 5C:
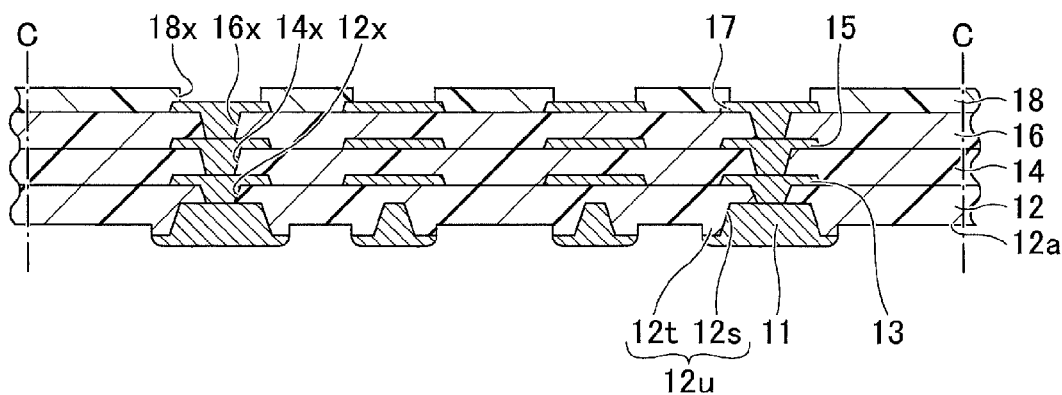

Then, in the process illustrated in FIG. 5C, the first and second metal layers 310, 330 of FIG. 5B are removed. Thereby, the pads 11 and the insulating layer 12 become exposed. For example, in a case where the first and second metal layers 310, 330 are formed of nickel (Ni), the first and second metal layers 310, 330 may be removed by a wet-etching method using a hydrogen peroxide/nitric acid type solution. The material of the pad 11 is a metal material (e.g., copper (Cu)) that cannot be etched with a liquid for etching nickel. Therefore, by selectively etching the first and second metal layers 310, 330 formed of nickel (Ni), only the first and second metal layers 310, 330 can be removed from the pad 11. That is, the pad 11 functions as an etch-stop layer (barrier layer). It is to be noted that, after removing the first and second metal layers 310, 330, the above-described process of forming a metal layer on the exposed surface of the pad 11 with an electroless plating method or the process of performing anti-oxidation such as OSP may be performed on the upper surface of the wiring layer 17.

After performing the process illustrated in FIG. 5C, the manufacturing of multiple wiring substrates 10 (see FIG. 1) is completed by cutting (e.g., dicing) the structure body illustrated in FIG. 5C into individual pieces (wiring substrates 10) at a cutting area C.

Hence, with the wiring substrate 10 according to the first embodiment, the pad 11 projecting from the external exposed surface 12a of the insulating layer 12 can be formed, so that at least a part of the surface of the pad 11 to be connected to the connection object can be formed into a flat surface. As a result, the contact area between the pad 11 and the connection object can be increased. Accordingly, the connection reliability between the pad 11 and the connection object can be improved. Further, the heights of the pads 11 can be prevented from becoming inconsistent (inconsistency in the amount in which the pads 11 project from the external exposed surface 12a of the insulating layer 12). Therefore, inconsistency of bonding strengths of the pads 11 are less likely to occur when mounting a semiconductor chip or the like on the pads 11. Accordingly, the connection reliability between the pads 11 and the semiconductor chip or the like can be improved.

Further, because the pads 11 are formed to project from the external exposed surface 12a of the insulating layer 12, a semiconductor chip can be flip-chip bonded to the wiring substrate 10 by forming bumps (projection electrode) on either the pads of the wiring substrate 10 or the pads of the semiconductor chip.

Further, in the pad 11, the eave part 11b covers an interface between the side surface of the pad body 11a and the insulating layer 12 (inner sidewall surface of the pad forming part 12u). Therefore, in a case of forming a metal layer on the exposed surface of the pad 11 or performing anti-oxidation such as OSP on the exposed surface of the pad 11 in the above-described processes of manufacturing of the wiring substrate 10, a plating liquid or a processing liquid can be prevented from entering the interface between the pad body 11a and the insulating layer 12.

Although it is possible for a blasting process to be used to form a part similar to the wier part 12t projecting from the external exposed surface 12a of the insulating layer 12, the blasting process is not preferred because a part of the insulating layer 12 may be unintentionally removed and cause a filler to become exposed from the external exposed surface 12a. If the filler is exposed from the external exposed surface 12a in a case of performing an electroless plating process to form a metal layer on an exposed surface of the pad 11, the exposed filler becomes a core from which a plating film is formed. Such problem does not occur because this embodiment does not use the blasting process to form the weir part 12t.

First Modified Example of First Embodiment

In the following a first modified example of the first embodiment, the processes illustrated in FIGS. 2B to 3B of the first embodiment are modified. In the first modified example of the first embodiment, like components are denoted with like reference numerals as the reference numerals of the first embodiment and are not further explained.

In the first modified example, the processes illustrated in FIGS. 2B to 3B may be changed with the following processes illustrated in FIGS. 6A to 6D.

First, after performing the process illustrated in FIG. 2A, a resist layer 320 is formed on the upper surface of the first metal layer 310. The resist layer 320 includes the opening part (s) 320x corresponding to a part at which the pad 11 is formed and an opening part 320y corresponding to a part at which both the pad 11 and the wiring pattern 21 are formed. The resist layer 320 is formed with the same process illustrated in FIG. 2B of the first embodiment. Because the opening part 320y is a part at which both the pad 11 and the wiring pattern 21 are formed whereas the opening part 320x is a part at which only the pad 11 is formed, the opening part 320y has a plan-view shape that is larger than a plan-view shape of the opening part 320x.

Figure 6A:
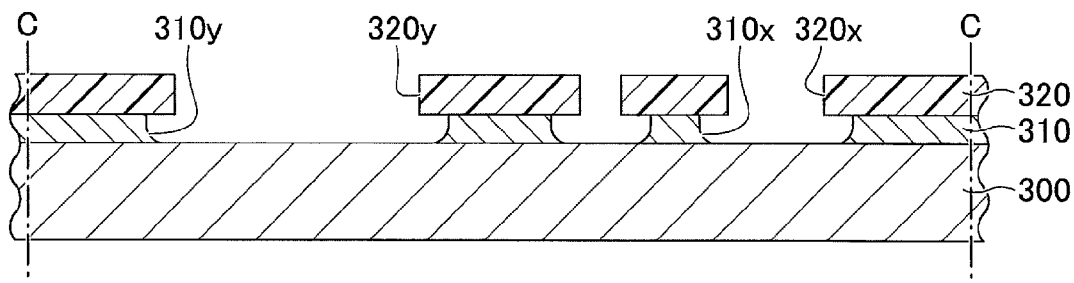
FIGS. 6A-6D are schematic diagrams illustrating processes for manufacturing the wiring substrate according to a first modified example of the first embodiment of the present invention.

Then, in the process illustrated in FIG. 6A, the recess part 310x is formed by removing the first metal layer 310 exposed in the opening part 320x, and a recess part 310y is formed by removing the first metal layer 310 exposed in the opening part 320y. In a case where the first metal layer 310 is formed of nickel (Ni), the recess parts 310x, 310y are formed with the same process illustrated in FIG. 2C of the first embodiment.

Figure 6B:
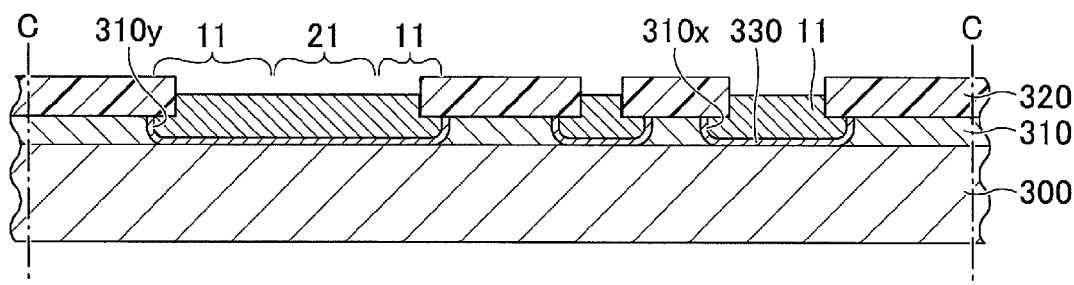

Then, in the process illustrated in FIG. 6B, the second metal layer (barrier layer) 330 that covers the bottom and inner sidewall surfaces of the recess parts 310x, 310y is formed with the same process illustrated in FIG. 2D of the first embodiment. Then, similar to the process illustrated in FIG. 3A, the pad 11 is formed to extend into the opening part 320x from the second metal layer 330 formed on the bottom and inner sidewall surfaces of the recess part 310x. In addition, the pad 11 and the wiring pattern 21 are formed to extend into the opening part 320y from the second metal layer 330 formed on the bottom and inner sidewall surfaces of the recess part 310y.

Figure 6C:
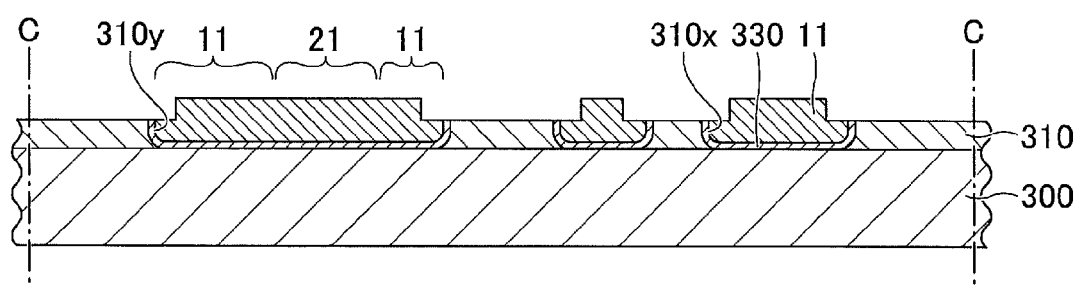
Figure 6D:
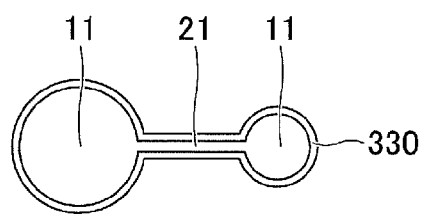

Then, in the process illustrated in FIG. 6C, the resist layer 320 is removed. Thereby, the pad 11 is exposed in the recess part 310x whereas the pad 11 and the wiring pattern 21 are exposed in the recess part 310y. As illustrated in FIG. 6D, the wiring pattern 21 may be formed, so that adjacent pads are electrically connected to each other. FIG. 6D is a plan view illustrating only the vicinity of the pad 11 and the wiring pattern 21 of FIG. 6C.

Then, similar to the processes illustrated in FIGS. 3C to 5C of the first embodiment, the manufacturing of multiple wiring substrates 10 are completed by cutting (e.g., dicing) the structure body illustrated in FIG. 5C into individual pieces (wiring substrates 10) at a cutting area C.

Accordingly, not only can a single pad 11 be formed on the second metal layer 330 in a recess part but also both the pad 11 and the wiring pattern 21 can be formed in a recess part.

First Application Example of the First Embodiment

The first application example of the first embodiment is a semiconductor package that includes a semiconductor chip mounted on the wiring substrate 10 (see FIG. 1) of the first embodiment. In the first application example of the first embodiment, like components are denoted with like reference numerals as the reference numerals of the first embodiment and are not further explained.

Figure 7:
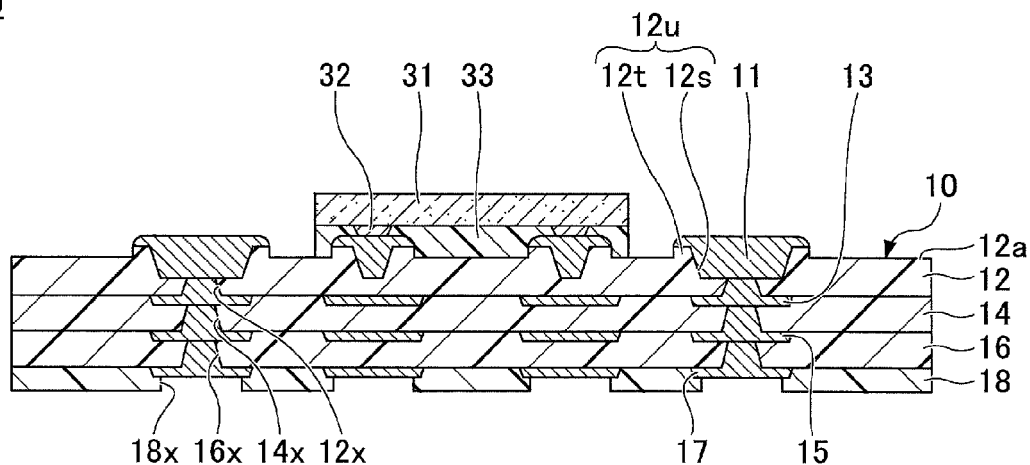
FIG. 7 is a cross-sectional view illustrating a semiconductor package according to a first application example of the first embodiment of the present invention.

FIG. 7 is a cross-sectional view illustrating a semiconductor package according to the first application example of the first embodiment. With reference to FIG. 7, the semiconductor package 30 includes the wiring substrate 10 of FIG. 1, a semiconductor chip 31, a projection electrode 32, and an underfill resin 33.

The semiconductor chip 31 includes a semiconductor substrate such as a silicon substrate (not illustrated) having a semiconductor integrated circuit (not illustrated) formed thereon. The semiconductor chip 31 further includes pads (not illustrated) that are electrically connected to the semiconductor integrated circuit. The projection electrodes 32 contact the pads. The projection electrodes 32 are electrically connected to the pads of the semiconductor chip 31 and the pads 11 of the wiring substrate 10. For example, a gold bump or a copper post may be used as the projection electrode 32. The underfill 33 fills in between the semiconductor chip 31 and the insulating layer 12 of the wiring substrate 10.

The semiconductor package 30 may be manufactured as follows. First, the wiring substrate 10 is prepared. Then, a resin film, which becomes the underfill resin 33, is adhered to the wiring substrate 10 to cover a portion of the pads 11 to be mounted to the semiconductor chip 31 and an area surrounding the pads 11. The resin film may be, for example, an epoxy resin in a semi-cured state. Then, the semiconductor chip 31 having the projection electrode 32 formed thereon is prepared. The semiconductor chip 31 is positioned, so that the projection electrode 32 and the pads 11 to be mounted to the semiconductor chip 31 face each other via a resin film. Then, the semiconductor chip 31 is pressed toward the wiring substrate 10, so that tips of the projection electrodes 32 contact the pads 11. Then, in this state, the resin film is cured to form the underfill resin 33.

Accordingly, with the first application example of the first embodiment, the semiconductor package 30 that includes the wiring substrate 10 having the semiconductor chip 31 formed thereon can be obtained. In this case, the contact area between the pad 11 and the projection electrode 32 can be increased because the projection electrode 32 is bonded to the flat surface of the pad body 11a of the pad 11 to be mounted to the semiconductor chip 31. Thereby, connection reliability between the pad 11 and the projection electrode 32 can be improved.

Second Application Example of First Embodiment

The second application example of the first embodiment is a semiconductor package having a POP (Package-On-Package) structure in which another semiconductor package is mounted on the semiconductor package 30 (see FIG. 7) of the first application of the first embodiment. In the second application example of the first embodiment, like components are denoted with like reference numerals as the reference numerals of the first embodiment and are not further explained.

Figure 8:
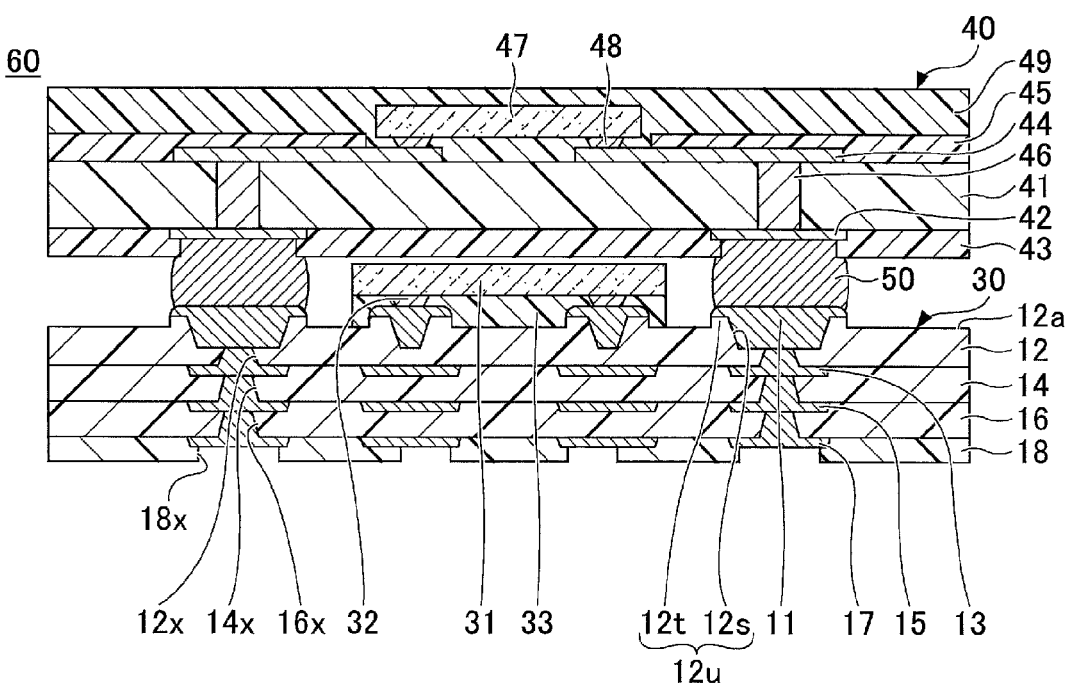
FIG. 8 is a cross-sectional view illustrating a semiconductor package according to a second application example of the first embodiment of the present invention.

FIG. 8 is a cross-sectional view illustrating a semiconductor package according to the second application example of the first embodiment. With reference to FIG. 8, the semiconductor package 60 includes the semiconductor package 30 of FIG. 7, a semiconductor package 40, and a bonding part 50.

The semiconductor package 40 includes a substrate 41, a wiring layer 42 formed on a lower surface of the substrate 41, and a solder resist layer 43 formed on the lower surface of the substrate 41 to selectively expose the wiring layer 42. The semiconductor package 40 further includes a wiring layer 44 formed on an upper surface of the substrate 41, and a solder resist layer 45 that is formed on the upper surface of the substrate 41 to selectively expose the wiring layer 44. The wiring layer 42 and the wiring layer 44 are electrically connected via a through-electrode 46 that penetrates the substrate 41. A part of the wiring layer 44 that is exposed by the solder resist layer 45 is used as a pad and is bonded to a projection electrode 48 formed in a semiconductor chip 47. The semiconductor chip 47 is encapsulated by a resin part 49 formed on the solder resist layer 45.

A part of the wiring layer 42 that is exposed by the solder resist layer 43 is used as a pad and is electrically connected to the pad 11 to be connected to the semiconductor package 40 (pad that is not connected to the semiconductor chip 31). For example, a solder ball may be used as the bonding part 50. The material of the solder ball may be, for example, an alloy including lead (Pb), an alloy including tin (Sn) and copper (Cu), an alloy including tin (Sn) and silver (Ag), or an alloy including tin (Sn), silver (Ag), and copper (Cu).

With the second application example of the first embodiment, a semiconductor package having a POP structure, that is, a structure having another semiconductor package 30 mounted on the semiconductor package 30 of the first application can be obtained. In this case, the contact area between the pad 11 and the bonding part 50 can be increased because the bonding part 50 is bonded to the flat surface of the pad body 11a of the pad 11 to be mounted on the package 30. Thereby, connection reliability between the pad 11 and the bonding part 50 can be improved.

Third Application Example of the First Embodiment

The third application example of the first embodiment is another semiconductor package that includes a semiconductor chip mounted on the wiring substrate 10 (see FIG. 1) of the first embodiment. In the third application example of the first embodiment, like components are denoted with like reference numerals as the reference numerals of the first embodiment and are not further explained.

Figure 9:
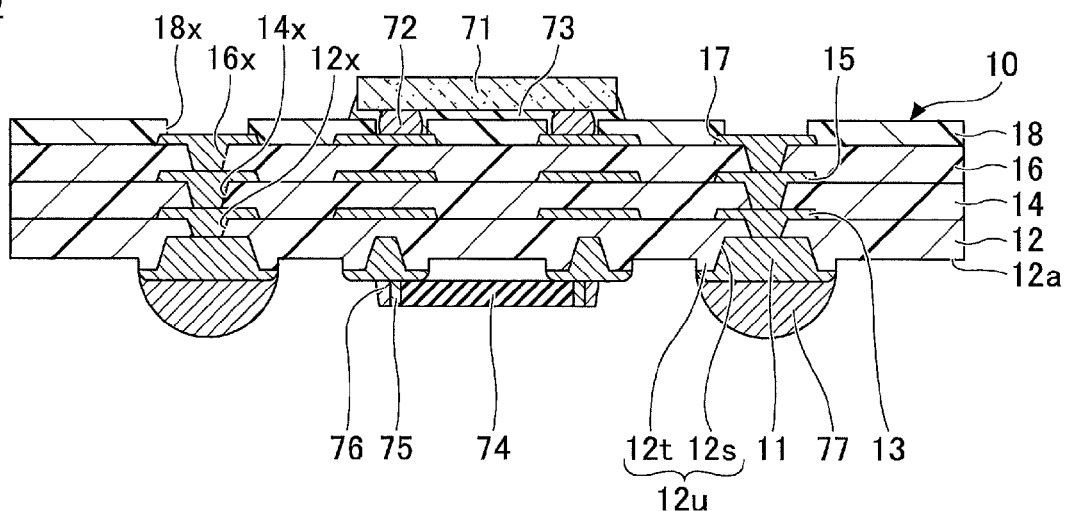
FIG. 9 is a cross-sectional view illustrating a semiconductor package according to a third application example of the first embodiment of the present invention.

FIG. 9 is a cross-sectional view illustrating a semiconductor package according to the third application example of the first embodiment. With reference to FIG. 9, the semiconductor package 70 includes the wiring substrate 10 of FIG. 1, a semiconductor chip 71, a projection electrode 72, an underfill resin 73, an electronic component 74 formed with an electrode 75, and a bonding part 76.

The projection electrode 72 of the semiconductor chip 71 electrically connects a pad (not illustrated) of the semiconductor chip 71 and the wiring layer (pad) 17 exposed from the solder resist layer 18 of the wiring substrate 10. For example, a solder bump may be used as the projection electrode 72. The underfill resin 73 fills in between the semiconductor chip 71 and the solder resist layer 18 of the wiring substrate 10.

The electrode 75 of the electronic component 74 is electrically connected to the pad 11 to be mounted on the electronic component via the bonding part 76. The bonding part 76 may be, for example, solder or a conductive paste. The electronic component 74 may be, for example, a chip capacitor, a chip resistor, or a chip inductor. An external connection terminal 77 such as a solder ball is formed on the pad 11 to be connected to another external device (i.e., pad 11 that is not connected to the electronic component 74).

Accordingly, a semiconductor chip may be mounted on a surface of the wiring substrate 10 (semiconductor chip mounting surface) that is opposite to the surface contacting the support body 300. Further, an electronic component such as a chip capacitor may be mounted on a surface opposite from the semiconductor chip mounting surface of the wiring substrate 10. In the wiring substrate 10, the diameters and pitches of the pads 11 to be used as external connection terminals may be larger than the diameters and pitches than the pads to be connected to the semiconductor chip or the electronic component.

Figure 10:
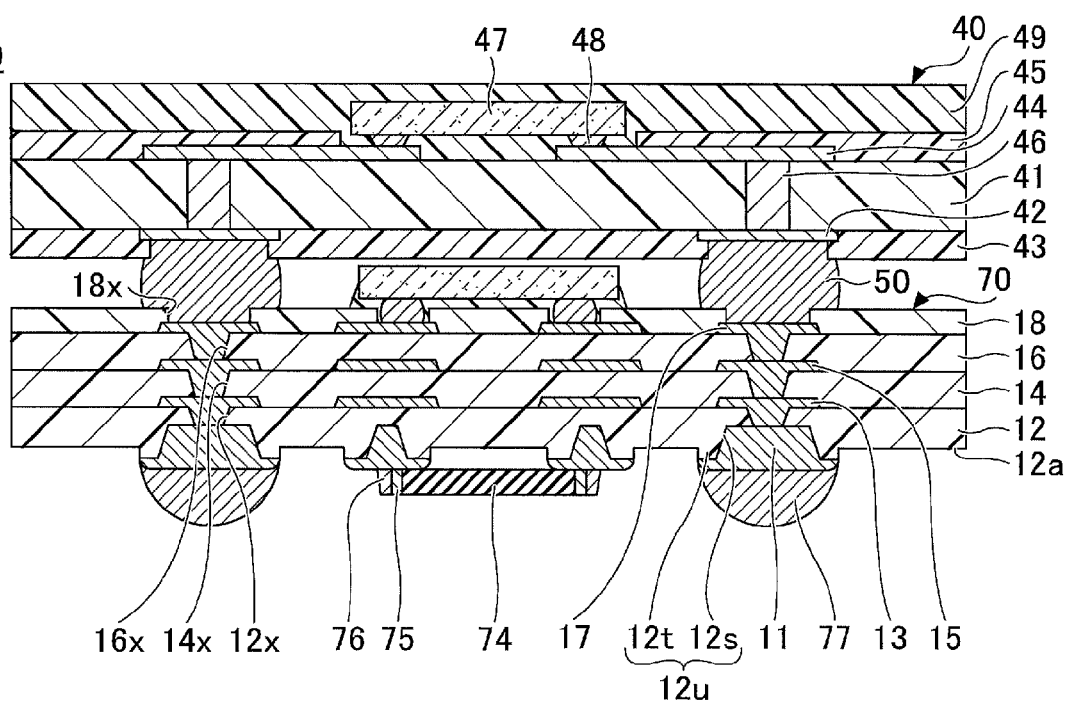
FIG. 10 is a cross-sectional view illustrating a semiconductor package according to a fourth application example of the first embodiment of the present invention.

Further, similar to the second application example of the first embodiment, a semiconductor package 80 having a POP structure, that is, a structure having another semiconductor package 40 mounted on the semiconductor package 70 can be obtained (see FIG. 10).

Second Modified Example of First Embodiment

In the following a second modified example of the first embodiment, an upper surface of a first metal layer formed on a support body is roughened. In the second modified example of the first embodiment, like components are denoted with like reference numerals as the reference numerals of the first embodiment and are not further explained.

Figure 11A:
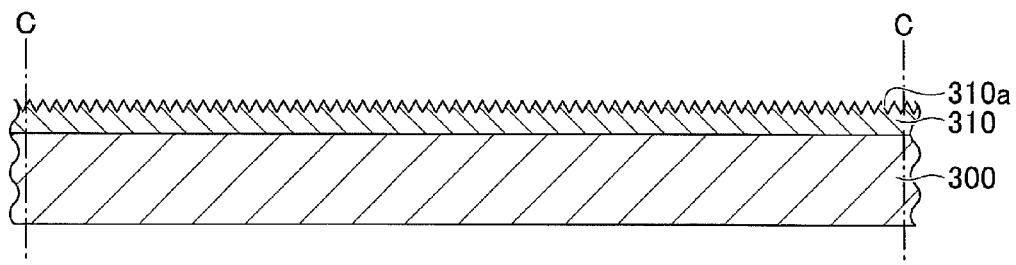
FIGS. 11A-11C are schematic diagrams illustrating processes for manufacturing the wiring substrate according to a second modified example of the first embodiment of the present invention.

In the second modified example, the processes illustrated in FIG. 2A may be changed with the following processes illustrated in FIG. 11A. In the process illustrated in FIG. 11A, the support body 300 is prepared. A first metal layer 310 having a roughened upper surface 310a is formed on the upper surface of the support body 300.

The first metal layer (nickel layer) 310 having a roughened upper surface 310a is formed by, for example, an electroplating method using a plating liquid including a mixture of nickel nitrate, boric acid, and nickel chloride. In this case, the upper surface 310a of the first metal layer (nickel layer) 310 formed by the electroplating method can roughened by adjusting the composition of the plating liquid or current density. Thereby, the upper surface 310a of the first metal layer 310 can be formed having fine irregularities. Alternatively, the first metal layer 310 may be formed on the upper surface of the support body 300 without having the upper surface 310a roughened, and the upper surface 310a can be roughened afterwards by performing an etching process on the upper surface 310a.

Figure 11B:
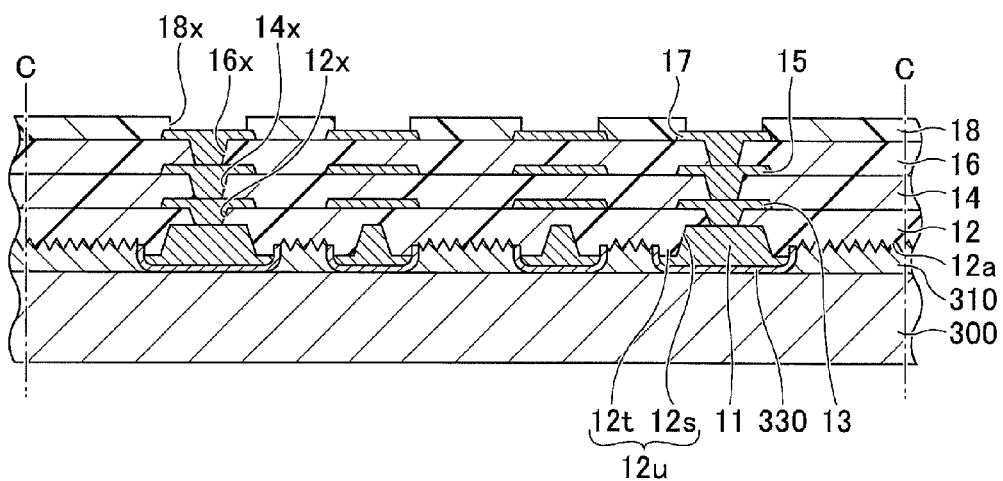
Figure 11C:
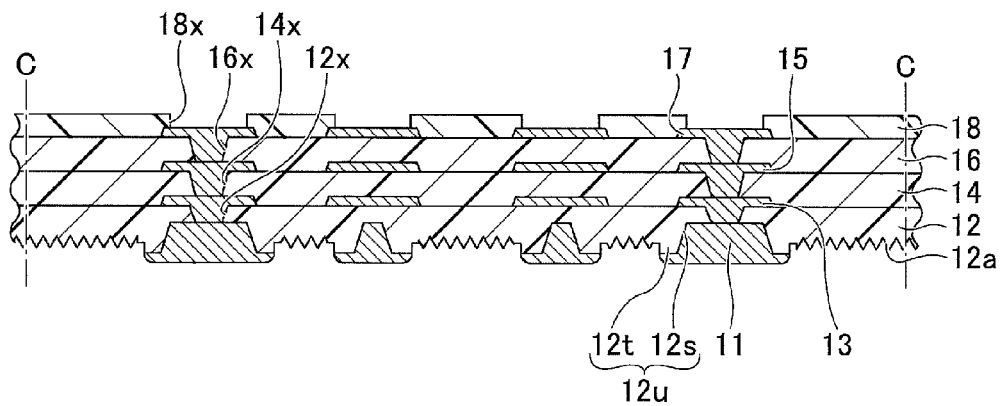

Then, as illustrated in FIG. 11B, a wiring layer or an insulating layer is layered on the support body by performing the same processes as those of the first embodiment. Then, as illustrated in FIG. 11C, the support body 300, and the first and second metal layers 310, 330 are removed by performing the same processes as those of the first embodiment. Because the irregularities formed on the upper surface 310a of the first metal layer 310 are transferred to the external exposed surface 12a of the insulating layer 12, the external exposed surface 12a of the insulating layer 12 becomes a roughened surface.

After performing the processes illustrated in FIG. 11C, the manufacturing of multiple wiring substrates 10A is completed by cutting (e.g., dicing) the structure body illustrated in FIG. 11C into individual pieces (wiring substrates 10A) at a cutting area C.

Figure 12:
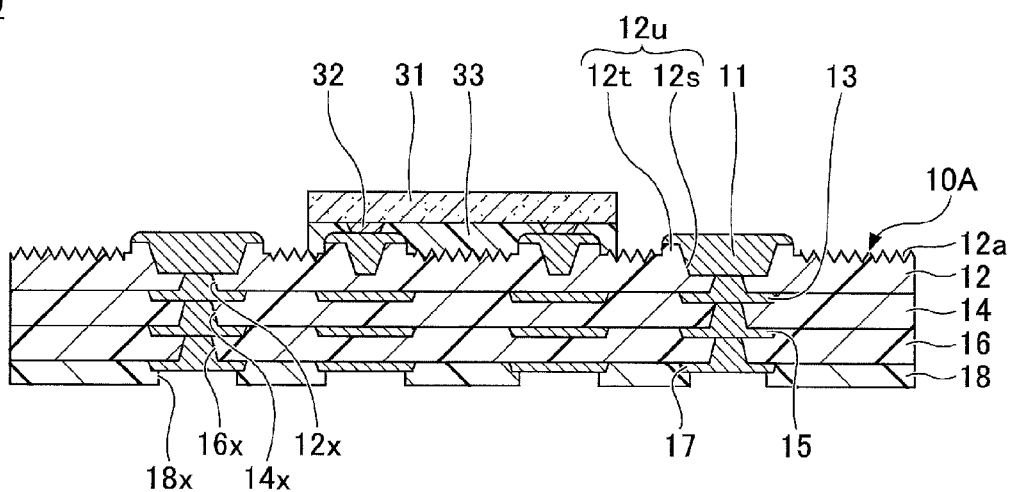
FIG. 12 is a cross-sectional view illustrating a semiconductor package according to a fifth application example of the first embodiment of the present invention.

Similar to FIG. 7, a semiconductor package 90 that includes the wiring substrate 10A having the semiconductor chip 31 formed thereon can be obtained (see FIG. 12). In FIG. 12, a so-called anchor effect occurs between the insulating layer 12 and the underfill resin 33 because the external exposed surface 12a of the insulating layer 12 has a roughened surface. Thereby, the bonding strength between the wiring substrate 10 and the semiconductor chip 31 can be improved.

Various aspects of the subject-matter described herein are set out non-exhaustively in the following numbered clauses:

1. A method for manufacturing a wiring substrate, the method comprising:
    forming a first metal layer on an upper surface of a support body;
    forming a resist layer including an opening part on an upper surface of the first metal layer;
    forming a recess part by selectively removing a part of the first metal layer via the opening part, the recess part including a bottom surface that exposes an upper surface of the support body and having a plan-view shape that expands further outward from an outer periphery of a plan-view shape of the opening part;
    forming a second metal layer that covers the upper surface of the support body exposed in the recess part and an inner sidewall surface of the recess part;
    forming a pad that extends into the opening part from the second metal layer;
    removing the resist layer;
    forming an insulating layer that covers the pad on the upper surface of the first metal layer;
    selectively removing the support body with respect to the first and second metal layers; and
    selectively removing the first and second metal layers with respect to the pad.

2. The method of clause 1, further comprising:
    roughening a surface of the pad that is exposed from the first and second metal layers,
    wherein the roughening is performed between the removing of the resist layer and the forming of the insulating layer.

3. The method of clause 1, wherein the forming of the first metal layer includes roughening the upper surface of the first metal layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
    an insulating layer that is an outermost layer of the wiring substrate and includes an external exposed surface;
    a pad forming part that is formed on a side of the external exposed surface; and
    a pad that projects from the external exposed surface;
    wherein the pad forming part includes
        a recess part that is recessed inward relative to the external exposed surface, and
        a weir part that projects outward relative to the external exposed surface and encompasses the recess part from a plan view,
    wherein the pad includes
        a pad body that is formed within the recess part and the weir part, and
        an eave part that is formed on the weir part and integrally formed with the pad body,
    wherein the pad body includes an end part that projects to the weir part,
    wherein the eave part projects in a horizontal direction from the end part of the pad body,
    wherein the end part of the pad body includes a flat surface, and
    wherein the insulating layer and the weir part are formed of an insulating resin.

2. The wiring substrate as claimed in claim 1,
    wherein the insulating layer and the weir part are integrally formed.

3. The wiring substrate as claimed in claim 1, wherein a cross section of the recess part has a tapered shape in which a width of the recess part at a side toward a bottom surface of the recess part is less than a width of the recess part at a side toward the external exposed surface.

4. The wiring substrate as claimed in claim 1, wherein a surface of the pad that contacts the recess part and the weir part has a roughened surface.

5. The wiring substrate as claimed in claim 1, further comprising:
    a via wiring that is connected to a part of the pad body formed on a bottom surface of the recess part,
    wherein a cross section of the via wiring has a tapered shape in which a width of the via wiring on a side opposite from the external exposed surface is greater than a width of the via wiring on a side of the external exposed surface.

6. The wiring substrate as claimed in claim 5,
    wherein a wiring layer is formed on the side opposite from the exposed outer surface of the insulating layer,
    wherein the wiring layer is integrally formed with the via wiring.

7. The wiring substrate as claimed in claim 1, wherein the external exposed surface has a roughened surface.

* * * * *